(12) United States Patent
Horiuchi et al.

(10) Patent No.: US 7,786,597 B2
(45) Date of Patent: Aug. 31, 2010

(54) MULTILAYER WIRING BOARD AND SEMICONDUCTOR DEVICE

(75) Inventors: Michio Horiuchi, Nagano (JP); Yasue Tokutake, Nagano (JP); Shigeaki Suganuma, Nagano (JP); Naoyuki Koizumi, Nagano (JP); Fumimasa Katagiri, Nagano (JP)

(73) Assignee: Shinko Electric Industries Co., Ltd, Nagano-shi, Nagano (JP)

( * ) Notice: Subject to any disclaimer, the term of this patent is extended or adjusted under 35 U.S.C. 154(b) by 0 days.

(21) Appl. No.: 12/326,371

(22) Filed: Dec. 2, 2008

(65) Prior Publication Data
US 2009/0146318 A1   Jun. 11, 2009

(30) Foreign Application Priority Data
Dec. 3, 2007   (JP) ............................. 2007-312137

(51) Int. Cl.
*H01L 23/52* (2006.01)
(52) U.S. Cl. ............................. 257/778; 257/E23.015
(58) Field of Classification Search ................ 257/772, 257/778, E23.015
See application file for complete search history.

(56) References Cited

U.S. PATENT DOCUMENTS

| 6,245,599 | B1 * | 6/2001 | Goto et al. ................... 438/129 |
| 6,818,977 | B2 * | 11/2004 | Poo et al. ..................... 257/685 |
| 2005/0040539 | A1 * | 2/2005 | Carlsgaard ................... 257/778 |
| 2006/0076691 | A1 * | 4/2006 | Prengel et al. ............... 257/778 |
| 2007/0057381 | A1 * | 3/2007 | Wong et al. .................. 257/778 |

FOREIGN PATENT DOCUMENTS

JP      11-186332      7/1999
JP      2001-35950     2/2001

* cited by examiner

*Primary Examiner*—Trung Dang
(74) *Attorney, Agent, or Firm*—Drinker Biddle & Reath LLP (57) ABSTRACT

A multilayer wiring board includes: a substrate; connection pads arranged in a square grid fashion; and wiring patterns. Relationship between the connection pads and the wiring patterns satisfies: $\{(Ndl+1)P-d-s\}/(w+s)>2Ndr+Ndl(a+1)+2a$, wherein P is a pitch of the connection pads, d is a diameter of the connection pads, s is a minimum interval between the wiring patterns and is a minimum interval between the wiring pattern and the connection pad that are adjacent to each other, w is a minimum width of the wiring patterns, Ndl is the number of non-pad rows in each of the non-pad regions, Ndr is the number of non-pad columns in each of non-pad region, and a is an integer of $(P-d-s)/(w+s)$.

13 Claims, 11 Drawing Sheets

MULTILAYER WIRING BOARD AND SEMICONDUCTOR DEVICE

This application claims priority from Japanese Patent Application No. 2007-312137, filed on Dec. 3, 2007, the entire contents of which are incorporated by reference herein.

BACKGROUND OF THE INVENTION

1. Technical Field

The present disclosure relates to a multilayer wiring board and a semiconductor device. More specifically, the present disclosure relates to a multilayer wiring board which is characterized by the geometry of wiring patterns and connection pads (or vias for connections to connection pads) formed on the respective wiring layers of the multilayer wiring board, as well as to a semiconductor device using the multilayer wiring board.

2. Related Art

Figure 12:
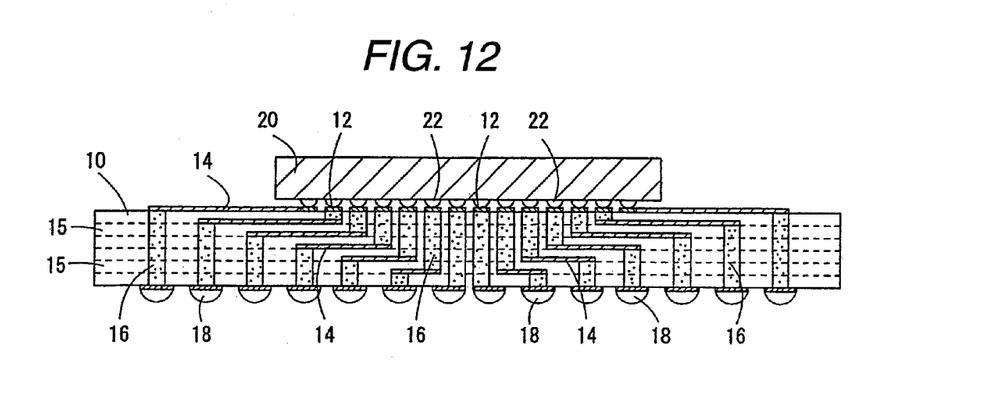
FIG. 12 is a sectional view of a semiconductor device in which a semiconductor element is mounted on a multilayer wiring board, according to the related art.

In the related art, a semiconductor element is mounted on a wiring board by flip-chip bonding in the following manner. For example, as shown in FIG. 12, a semiconductor element 20 is mounted on a wiring board 10 such that connection pads 12 that are provided in a semiconductor element mounting area of the wiring board 10 and bumps 22 that are formed as electrode terminals of the semiconductor element 20 are aligned with respect to each other. To this ends the connection pads 12 which are provided in the semiconductor element mounting area of the wiring board 10 have the same plan-view geometry as the bumps (electrodes) 22 of the semiconductor element 20.

In semiconductor elements, with the increase in the number of inputs and outputs (I/O), a large number of electrode terminals (bumps) have come to be provided on the electrode terminal forming surface at higher density. Accordingly, electrode pads that are formed on a wiring board have come to be arranged at a very high density.

Wiring patterns for electrical connections to external connection terminals are connected to connection pads formed on the wring board. One end of each wiring pattern is located in an area (pad array area) where the connection pads are disposed in an area array or peripheral geometry, and the other end is located outside the pad array area. Therefore, wiring patterns to be connected to connection pads that are located in an inside portion of the pad array area need to be routed out so as to pass between connection pads.

However, when pad-interval between adjoining connection pads is small, the number of wiring patterns that can pass between adjoining connection pads is limited and hence the wiring patterns cannot be arranged so as to be connected to all connection pads in one wiring layer. This is because plural wiring layers 15 are layered, routable wiring patterns 14 are formed on each layer, and the connection pads 12 are electrically connected to external connection terminals IS through vias 16 (see FIG. 12).

The simplest routing method of the wiring patterns to be connected to the connection pads 12 is to route out wiring patterns 14 of each wiring layer 15 from each connection pad array loop in the pad array area in such a manner that the wiring layer 15 goes away from the semiconductor-element-side surface of the wiring board 10 as the corresponding loop goes inward starting from the outermost loop. However, this method has a problem in that the wiring patterns 14 cannot be routed out efficiently and the number of wiring layers 15 of the wiring board 10 becomes large.

As a method for solving the above problem, there is a method of periodically providing no-pad regions (i.e., regions where no pads are disposed) in an outer peripheral portion of a pad array area where connection pads are disposed in an area array geometry or a peripheral geometry. This method makes it possible to route out the wiring patterns efficiently from the pad array area and to thereby decrease the number of wiring layers of the wiring board.

To achieve the above pad geometry, it is necessary to design a semiconductor element so that its bumps are arranged to correspond to the geometry of the connection pads of the wiring board; for example, it is necessary to form, in an outer peripheral portion of a bump geometry area, no-bump regions (i.e., regions where no bumps are disposed) or electrodes that need not be connected to any connection pads of the wiring board (see e.g., JP-A-11-186332 and JP-A-2001-35950).

Incidentally, in semiconductor elements, the bump pitch is becoming increasingly small as the number of inputs and outputs increases. For example, consideration will be given to a relationship between the number of wiring patterns that can pass between adjoining connection pads and the bump pitch and the diameter of the connection pads to which the bumps are to be connected. Two 8-μm-wide wiring patterns can pass between adjoining connection pads when the bump pitch and the connection pad diameter are 110 μm and 70 μm, respectively, and one 8-μm-wide wiring pattern can pass between adjoining connection pads when the bump pitch and the connection pad diameter are 100 μm and 70 μm, respectively. And no 8-μm-wide wiring pattern can pass between adjoining connection pads when the bump pitch and the connection pad diameter are 90 μm and 70 μm respectively. In the last case, one wiring pattern comes to be able to pass between adjoining connection pads when its width is reduced to 6 μm.

However, in a manufacturing method of the related-art multilayer wiring board (build-up wiring board) which uses an organic material as a base material, it is very difficult to realize wiring patterns that are narrower than 8 μm. Under such a condition that no wiring pattern can pass between adjoining connection pads, wiring patterns can be routed out from only one outermost loop of the pad array area. Wiring patterns need to be routed out from the connection pads on the second outermost loop by using the next wiring layer, and so forth.

However, with increase in the number of wiring layers of a wiring board, there is a problem in that the production yield of the wiring board lowers. That is, in order to increase the production yield of a wiring board, it is advantageous to make the number of wiring layers of the wiring board as small as possible. As another method, it is thought to enable formation of narrower wiring patterns by increasing formation accuracy of the wiring pattern. However, this unavoidably increases the manufacturing cost Therefore, a designing method is desired which can decrease the number of wiring layers and increase the production yield of a wiring board while using the conventional manufacturing method, and which does not impose an excessive load on the layout of a semiconductor element.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a multilayer wiring board on which a semiconductor element is to be mounted by flip-chip bonding and which makes it possible to route out wiring patterns efficiently from a pad array area, and a semiconductor device using the multilayer wiring board. In the multilayer wiring board according to exemplary embodiments of the present invention, it is possible to increase the production yield of the wiring board and also to facilitate a manufacturing method of the wiring board with such a design that the geometry of connection pads in the pad array area is not altered to a large extent, that is, the load on the designing of the semiconductor element is minimized.

According to one or more aspects of the present invention, there is provided a multilayer wiring board including: a substrate; a plurality of connection pads disposed on the substrate and arranged in a square grid fashion in a pad array area, wherein non-pad regions are arranged periodically along an outer periphery of the pad array area; a plurality of wiring patterns each connected to a corresponding one of the plurality of connection pads. The connection pads and the wiring patterns are arranged so as to satisfy:

$$\{(Ndl+1)P-d-s\}/(w+s) \geq 2Ndr+Ndl(a+1)+2a,$$

wherein P is a pad pitch of the connection pads, d is a diameter of the connection pads, s is a minimum interval between the wiring patterns and is a minimum interval between the wiring pattern and the connection pad that are adjacent to each other, w is a minimum width of the wiring patterns, Ndl is the number of non-pad rows in each of the non-pad regions, Ndr is the number of non-pad columns in each of the non-pad region, and a is an integer of $(P-d-s)/(w+s)$ According to one or more aspects of the present invention, the connection pads and the wiring patterns are arranged so as to satisfy:

$$(\sqrt{2} \times P-d-s)/(w+s) \geq 1.$$

According to one or more aspects of the present invention, there is provided a multilayer wiring board including: a substrate; a plurality of connection pads disposed on the substrate and arranged in a hexagonal grid fashion in a pad array area, wherein non-pad regions are arranged periodically along an outer periphery of the pad array area; a plurality of wiring patterns each connected to a corresponding one of the plurality of connection pads. The connection pads and the wiring patterns are arranged so as to satisfy:

$$\{(Ndl+1)P-d-s\}/(w+s) \geq 2Ndr+Ndl(a+1)+2a-1$$

wherein P is a pad pitch of the connection pads, d is a diameter of the connection pads, s is a minimum interval between the wiring patterns and is a minimum interval between the wiring pattern and the connection pad that are adjacent to each other, w is a minimum width of the wiring patterns, Ndl is the number of non-pad rows in each of the non-pad regions, Ndr is the number of non-pad columns in each of the non-pad region, and a is an integer of $(P-d-s)/(w+s)$.

According to one or more aspects of the present invention, the connection pads and the wiring patterns are arranged so as to satisfy:

$$(\sqrt{3} \times P-d-s)/(w+s) \geq 1.$$

According to one or more aspects of the present invention, the connection pads are arranged so as to satisfy:

$$P-d < w+2s.$$

According to one or more aspects of the present invention, each of the non-pad regions is formed by removing one connection pad in a row direction of the pad array area and plural connection pads in a column direction of the pad array area.

According to one or more aspects of the present invention, the non-pad regions are arranged at a rate of one non-pad region per three rows.

According to one or more aspects of the present invention, each of the non-pad regions is formed by removing two connection pads in a row direction of the pad array area and plural connection pads in a column direction of the pad array area, and the non-pad regions are arranged at a rate of two non-pad regions per four rows.

According to one or more aspects of the present invention, there is provided a semiconductor device including: the multilayer wiring board; and a semiconductor element mounted on the multilayer wiring board by flip-chip bonding.

According to exemplary embodiments of the present invention, the non-pad regions are disposed along the outer periphery of the pad array area, and thus the multilayer wiring board makes it possible to efficiently route out wiring patterns from the pad away area provided on the board and to reduce the number of wiring layers of the multilayer wiring board. Difficulties in manufacture of a multilayer wiring bound are thus lowered, whereby the production yield can be increased and the manufacturing cost can be reduced.

Other aspects and advantages of the present invention will be apparent from the following description, the drawings, and the claims.

DETAILED DESCRIPTION OF EXEMPLARY EMBODIMENTS OF THE INVENTION (Overall Structure of Multilayer Wiring Board)

Figure 1:
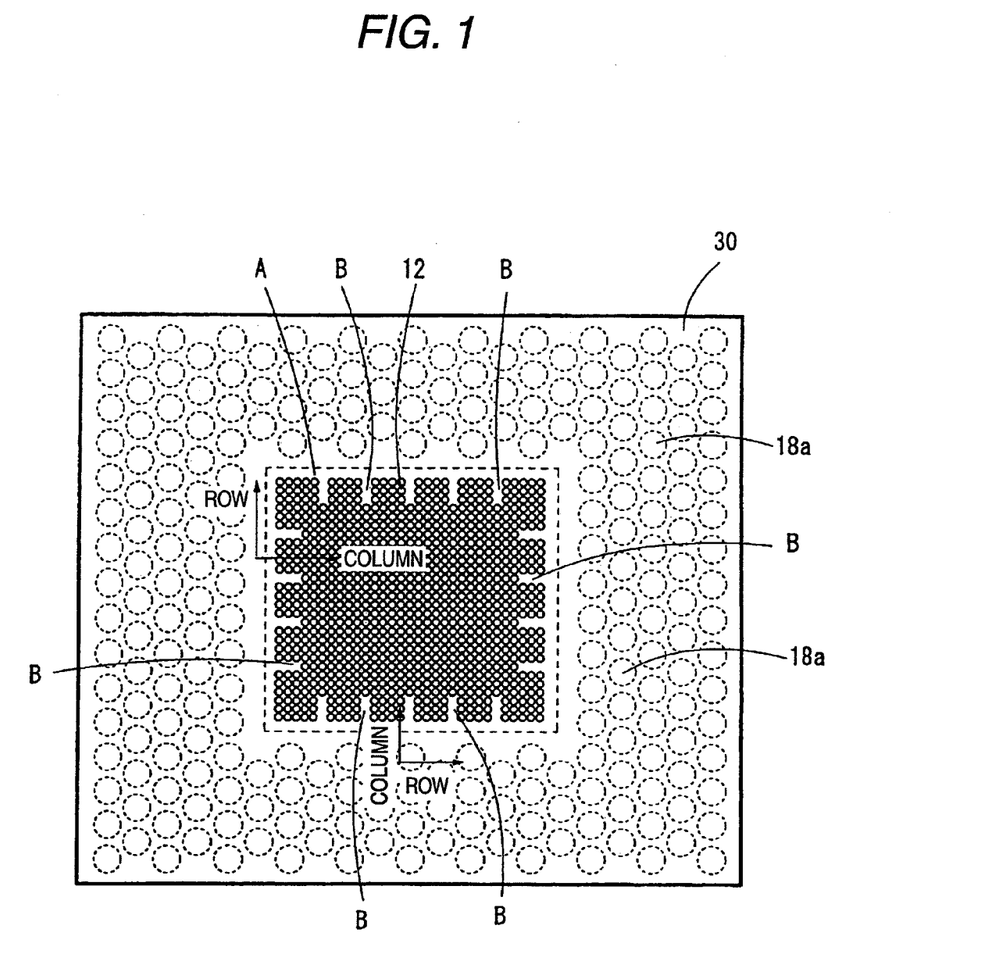
FIG. 1 is a plan view of a semiconductor element mounting surface of a multilayer wiring board according to an exemplary embodiment of the present invention and shows an example of geometry of connection pads.

FIG. 1 is a plan view of a semiconductor element mounting surface of a multilayer wiring board 30 according to an exemplary embodiment of the present invention and shows an example of geometry of connection pads 12. The connection pads 12 for flip-chip bonding a semiconductor element are disposed on the semiconductor element mounting surface of the multilayer wiring board 30, and pads 18a (broken lines) to which external connection terminals such as solder balls are bonded are disposed on the surface opposite to the semiconductor element mounting surface.

The connection pads 12 are disposed in a pad array area A that occupies an almost central portion of the semiconductor element mounting surface of the multilayer wiring board 30 so as to have the same plan-view geometry as bumps of the semiconductor element. Whereas the connection pads 12 are a little smaller in diameter than the bumps (electrodes) of the semiconductor element, the pitch of the connection pads 12 is almost the same as the bump pitch of the semiconductor element.

The multilayer wiring board 30 of this embodiment is characterized by the geometry of the connection pads 12 which are formed on the surface of the multilayer wiring board 30. More specifically, the embodiment of FIG. 1, in which the connection pads 12 are arranged in a square grid fashion, is characterized in that regions (non-pad regions B) where no connection pads 12 are disposed are provided periodically along the outer periphery of the pad array area A. Various methods for setting the non-pad regions B are available. In the embodiment, the non-pad regions B are provided in such a manner that one connection pad 12 is removed in a "row direction" of the pad array area A and one or more connection pads 12 are removed in a "column direction" of the pad array area A. In this specification, the "row direction" means a direction that is parallel with each side of the outer periphery of the pad array area A and the "column direction" means a direction that is orthogonal to each side of the outer periphery of the pad array area A. That is, the "column direction" is a direction that is orthogonal to the "row direction".

In FIG. 1, four or five non-pad regions B are arranged along each side (row direction) of the pad array area A. To set the non-pad regions B in the pad array area A in the above manner, it is necessary to design an geometry, in the electrode forming area, of the bumps (electrodes) of the semiconductor element so that it conforms to the geometry of the connection pads 12 in the pad array area A. In the method in which the non-pad regions B are arranged periodically along the outer periphery of the pad array area A, the layout of a bump geometry can be achieved without obstructing the layout of the semiconductor element much.

(Square Grid Array)

Figure 2A:
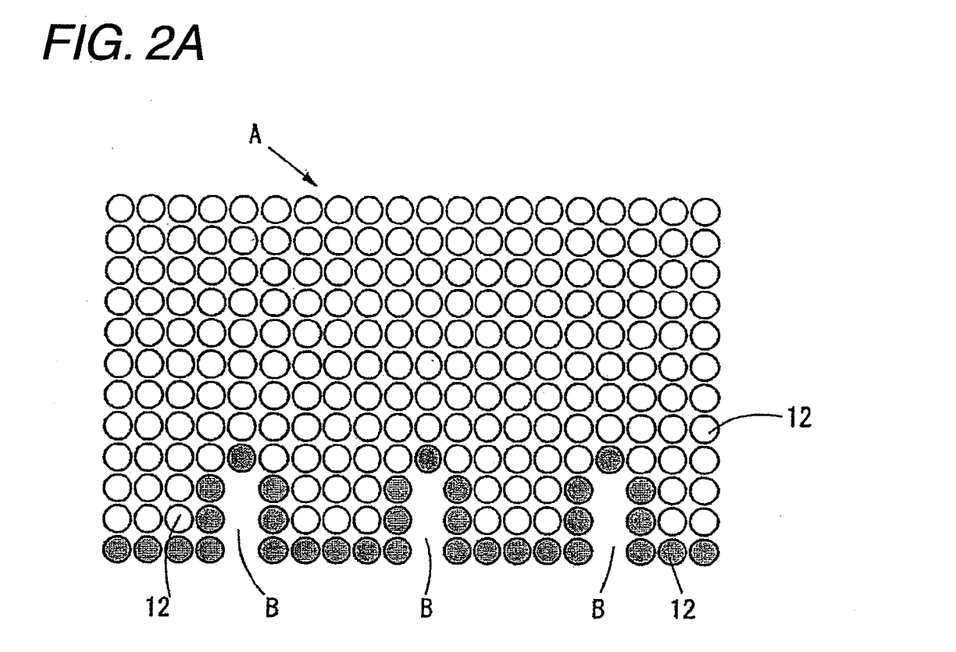
FIGS. 2A and 2B illustrate non-pad regions that are provided in a square grid array.

FIG. 2A shows an example in which connection pads 12 are arranged in a square grid fashion. In this example, non-pad regions B having 1-row/3-column are arranged along the outer periphery of the pad array area at a rate of one non-pad region B per six rows. That is, each non-pad region B is formed by removing three (1-row/3-column) connection pads 12 from a state that the pad array area is completely filled with connection pads 12 to its outer periphery.

Figure 2B:
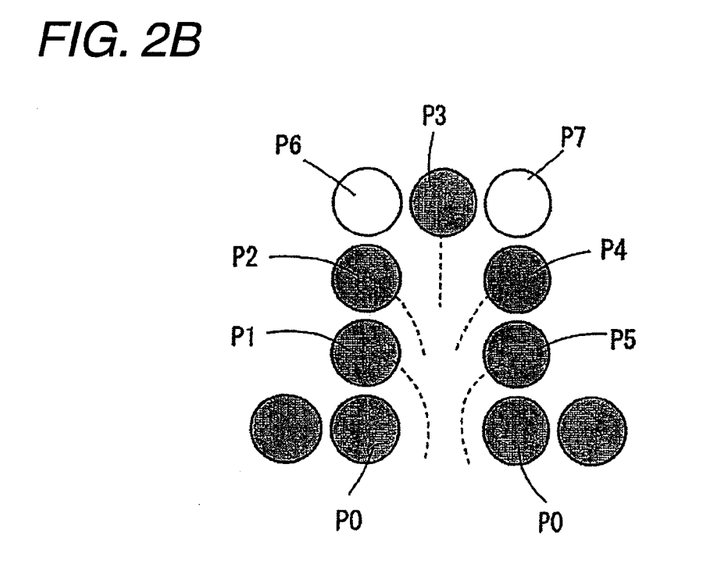

FIG. 2B is an enlarged view of one of the non-pad regions B. When the non-pad regions B are provided along the outer periphery of the pad array area A as shown in FIG. 2A, the non-pad regions B can be used as regions via which wiring patterns are routed out. A description will be hereinafter given of how to route out wiring patterns from connection pads P1-P5 that faces one non-pad region B.

Wiring patterns can be routed out directly from connection pads P0 which are located on the outermost loop of the pad array area A without using the non-pad region B. Therefore, five wiring patterns in total are routed out through the opening of the non-pad region B, which is located between the two connection pads P0.

Figure 3A:
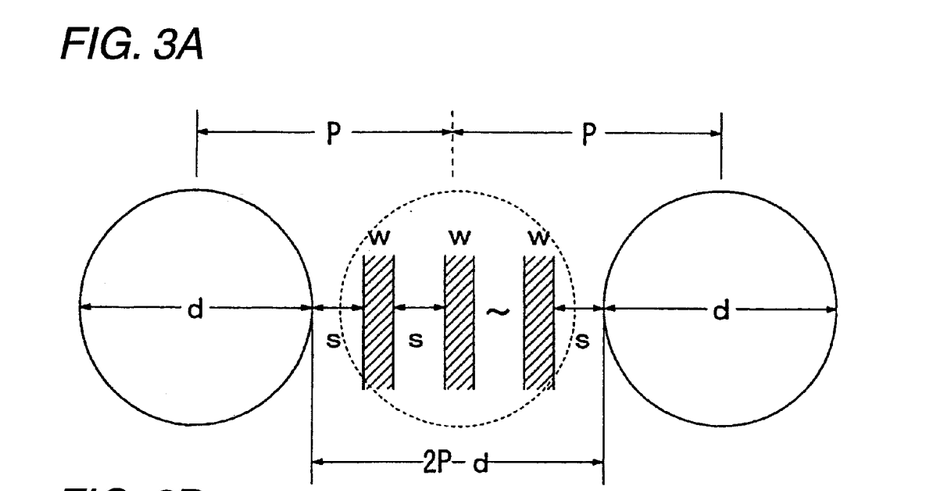
FIGS. 3A to 3C are views to describe a relationship between adjoining connection pads and wiring patterns therebetween.

FIG. 3A shows a relationship between adjoining connection pads and wiring patterns that are routed out via the non-pad region B so as to pass between these connection pads. Then, the interval between the connection pads is given by (2P−d) and the number of wiring patterns that can pass between the connection pads is given by (2P−d−s)/(w+s), where P, D, s, and w represent the pad pitch of the connection pads, the diameter of the connection pads, the minimum interval between the wiring patterns and between a wiring pattern and a connection pad that are adjacent to each other, and the minimum width of the wiring patterns, respectively.

The number of wiring patterns that can pass between the connection pads should be larger than or equal to the number of connection pads that face the non-pad region B. For generalization, the number of non-pad rows and the number of non-pad columns in the non-pad region B are represented by Ndl and Ndr, respectively. To route out wiring patterns from all connection pads facing the non-pad region B, the following equation should be satisfied.

$$\{(Ndl+1)P-d-s\}/(w+s) \geq 2Ndr+Ndl(a+1)+2a \qquad (1),$$

where a is given by [(P−d−s)/(w+s)] (i.e., an integer of (P−d−s)/(w+s)).

Although, in the above embodiment the number of non-pad rows in each non-pad region B is set equal to one, Equation (1) is not limited to such a case. In short, the right side of Equation (1) means the number of connection pads facing the non-pad region B. Also, a in the right side of Equation (1) means the number of wiring patterns that can be routed between the connection pads that are adjacent to each other.

Equation (1) is a general expression that connection pads disposed in a pad array area and wiring patterns should satisfy when the wiring patterns are routed out from the connection pads to outside of the pad array area.

Various methods for routing out wiring patterns from inside to outside of the pad array area are available depending on the pitch and the diameter of connection pads, the width of wiring patterns, whether wiring patterns can be routed out so as to pass between adjoining connection pads, and other parameters and conditions. Further, although exemplary embodiments of the present invention will be described in a case of a=0 (i.e., in a case where no wiring patterns can be routed between the connection pads that are adjacent to each other), the present invention is not limited thereto. Of course, exemplary embodiments of the present invention can be also applied in a case of a≠0.

FIGS. 4A to 4E show geometries of connection pads, from which wiring patterns are routed out, in the respective wiring layers in a case that non-pad regions B are set in the manner shown in FIG. 2. In this condition, wiring patterns are routed out from all connection pads facing each non-pad region B, and it is assumed that no wiring pattern can pass between closest connection pads or between obliquely adjoining connection pads.

FIGS. 4A to 4E show connection pads, from which wiring patterns are routed out, in first to fifth wiring layers L1-L5, respectively.

Figure 4A:
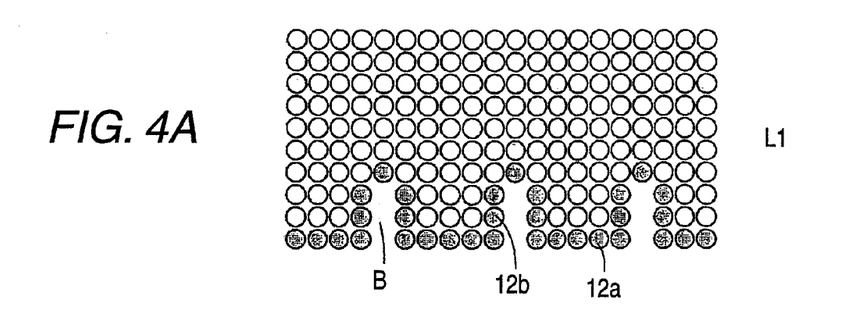
FIGS. 4A to 4E illustrate geometries of routable connection pads that are arranged on the respective wiring layers in a square grid array.

As for the first wiring layer L1, wiring patterns are routed out from connection pads 12a located on the outermost loop of the pad array area and five connection pads 12b that face each non-pad region B.

Figure 4B:
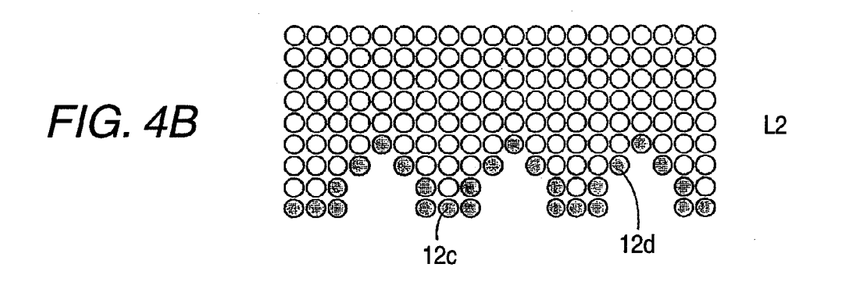

As for the second wiring layer L2, among the connection pads that remain after eliminating the connection pads from which the wiring layers are routed out in the first wiring layer (actually, vias (plan-view positions) for connections to these connection pads in the pad array area), wiring patterns are routed out from connection pads 12c located on the outermost loop and connection pads 12d that face the non-pad regions B.

Figure 4C:
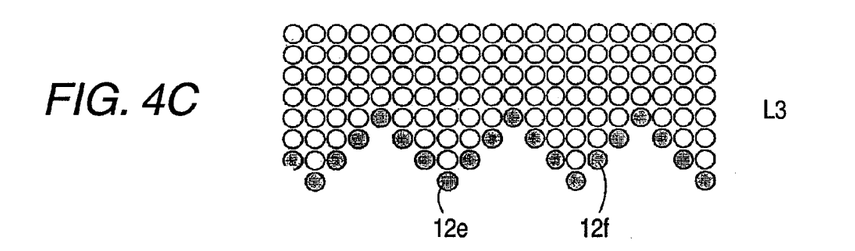
Figure 4D:
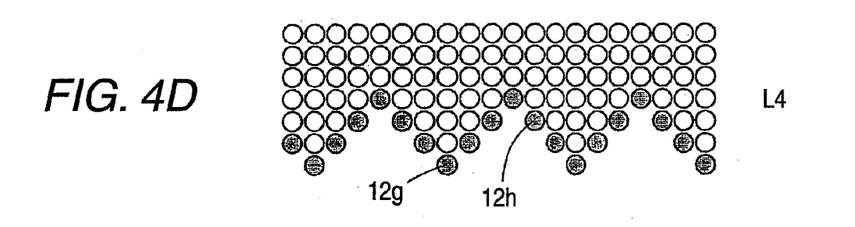
Figure 4E:
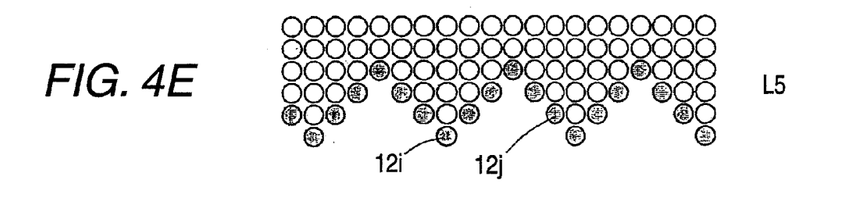
Figure 5A:
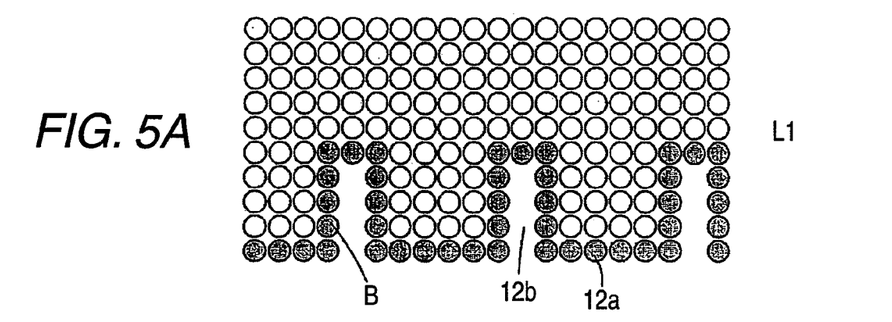
FIGS. 5A to 5D illustrate geometries of routable connection pads that are arranged on the respective wiring layers in a square grid array in which non-pad regions are set differently than in the example of FIGS. 4A to 4E.
Figure 5B:
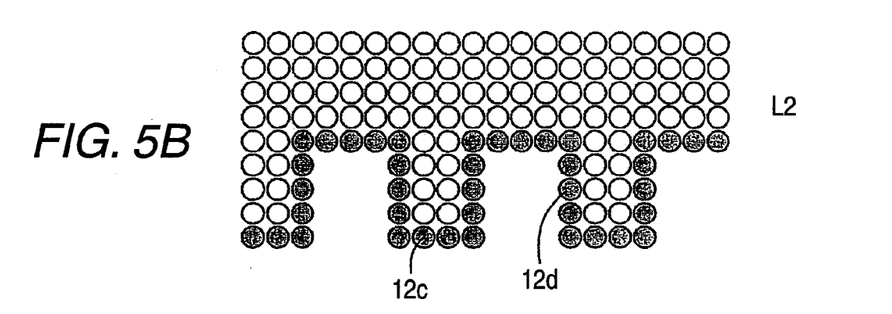
Figure 5C:
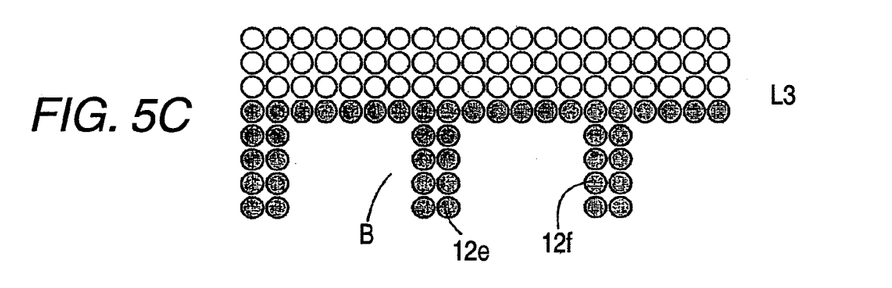
Figure 5D:
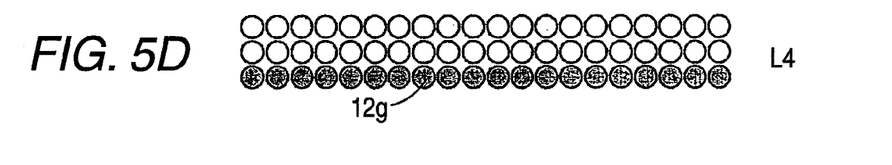

As for each of the third, fourth, and fifth wiring layers L3-L5, triangular non-pad regions B are formed and wiring patterns are routed out from connection pads 12e, 12g, or 12i located on the outermost loop and connection pads 12f, 12h, or 12j that face the non-pad regions B.

The wiring patterns are routed out form the connection pads in order in the above-described manner, whereby the wiring patterns can be routed out from all the connection pads provided in the pad array area and the connection pads are thereby electrically connected to external connection terminals.

The geometries of the routable connection pads for the individual wiring layers that are shown in FIG. 4 correspond to the case that no wiring pattern can pass between closest connection pads or obliquely adjoining connection pads. The condition that no wiring pattern can pass between closest connection pads is given by the following equation:

$$P-d<w+2s \quad (2)$$

and the condition that no wiring pattern can pass between obliquely adjoining connection pads is given by the following equation:

$$(\sqrt{2} \times P-d-s)/(w+s)<1 \quad (3)$$

Figure 3B:
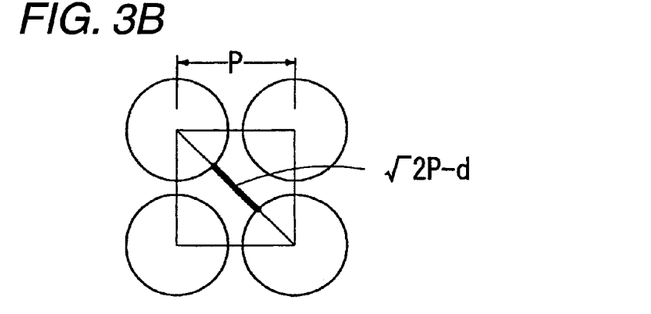

As shown in FIG. 3B, the interval between obliquely adjoining connection pads is given by $\sqrt{2}P-d$. Thus, Equation (3) can be derived.

FIGS. 5A to 5D show geometries of connection pads, from which wiring patterns are routed out, in the respective wiring layers in a case that the wiring pattern routing-out conditions are somewhat relaxed from those of the above example, that is, it is assumed that no wiring pattern can pass between closest connection pads but one or more wiring patterns can pass between obliquely adjoining connection pads. In this case, the above-mentioned Equation (1) and the following conditions should be satisfied.

$$P-d<w+2s \quad (4)$$

$$(\sqrt{2} \times P-d-s)/(w+s) \geq 1 \quad (5)$$

In this case, in FIG. 2B, wiring patterns can be routed out from connection pads P6 and P7 in addition to the connection pads P1-P5.

FIGS. 5A to 5D show an example in which non-pad regions B having 1-row/4-column are arranged along the outer periphery of a pad array area at a rate of one non-pad regions B per seven rows. FIG. 5A to 5D show connection pads from which wiring patterns are routed out in first to fourth wiring layers L1-L4, respectively.

As for the first wiring layer L1, wiring patterns are routed out from connection pads 12a located on the outermost loop of the pad array area and nine connection pads 12b that face each non-pad region B. As for each of the second and third wiring layers L2 and L3, wiring patterns are routed out from connection pads 12c or 12e located on the outermost loop and connection pads 12d or 12f that face the non-pad regions. As for each of the fourth wiring layer L4 and the following wiring layers, wiring patterns are routed out from connection pads 12g located on the outermost loop, which is an ordinary routing method.

As can be seen from FIGS. 4A to 5D, in a case where non-pad regions B are set in a pad array area, the geometries of connection pads, from which wiring patterns are routed out in the respective wiring layers, depend on the pitch of the non-pad regions B. Therefore, it is advantageous to set non-pad regions B so as to minimize the number of necessary wiring layers. Further, it is advantageous that a relationship (i.e., a condition for this purpose) should be satisfied:

$$N1 \leq (\text{interval between non-pad regions}) \leq 2(N1-1)+2 \quad (6),$$

where N1 is the number of wiring layers where influence of the non-pad regions B on the routing of wiring layers remains (called "the number of routing layers"). In the example of FIGS. 5A to 5D, the first to third wiring layers L1-L3 are routing layers. The term "interval between non-pad regions" means the number of connection pads that are interposed between adjoining non-pad regions B.

Naturally, in a case where one or more wiring patterns can pass between adjoining connection pads, the number of wiring patterns that can be routed out of the pad array area in each wiring layer can be increased further and hence the number of wiring layers can be decreased further.

(Hexagonal Grid Array)

Figure 6A:
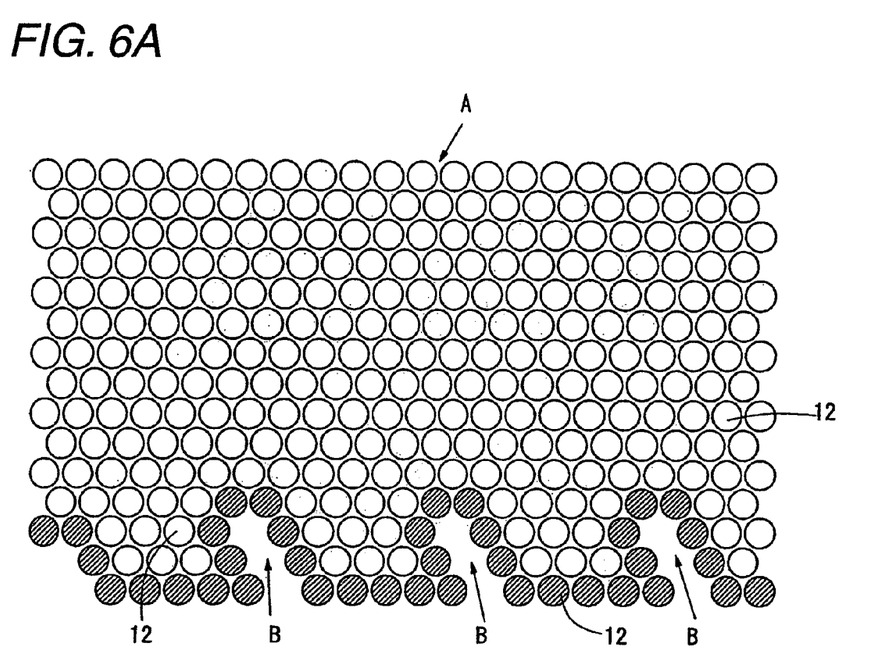
FIGS. 6A and 6B illustrate non-pad regions that are provided in a hexagonal grid array.

FIGS. 6A and 6B show an example in which connection pads are arranged in a hexagonal grid fashion and non-pad regions B are provided along the outer periphery of a pad array area. As shown in FIG. 6A, non-pad regions B having 1-row/3-column are arranged along the outer periphery of the pad array area at a rate of one non-pad region B per six rows.

Figure 6B:
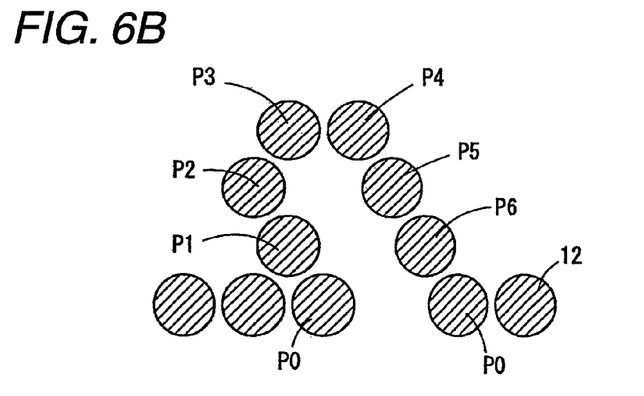
Figure 7A:
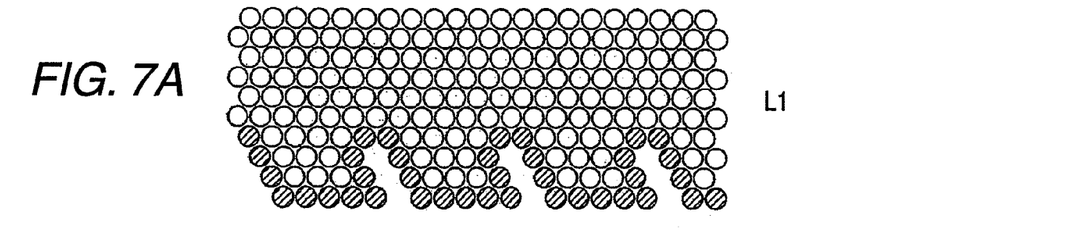
FIGS. 7A to 7E illustrate geometries of routable connection pads that are arranged on the respective wiring layers in a hexagonal grid array.
Figure 7B:
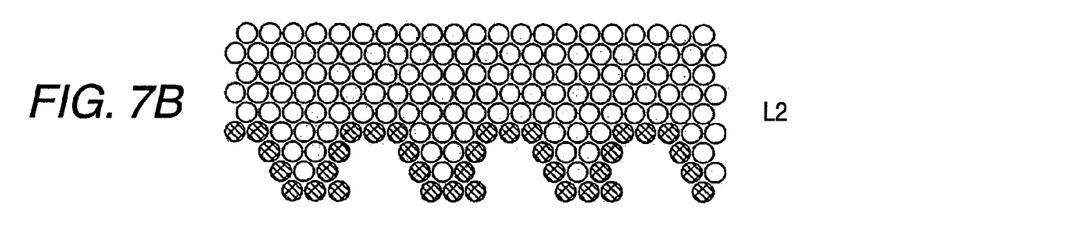
Figure 7C:
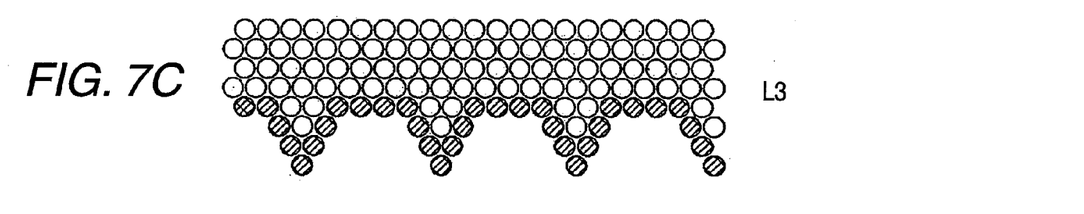
Figure 7D:
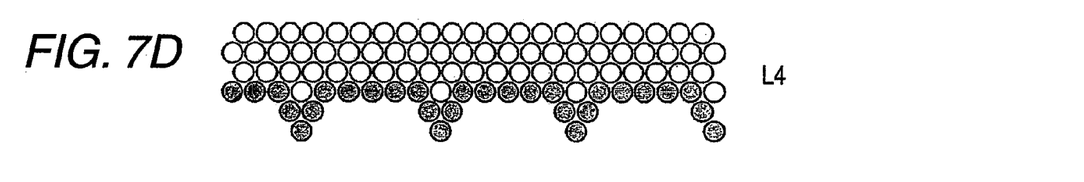
Figure 7E:
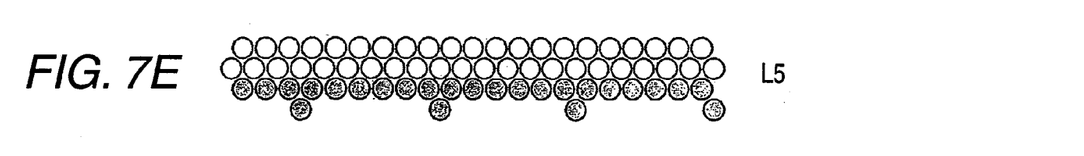
Figure 8A:
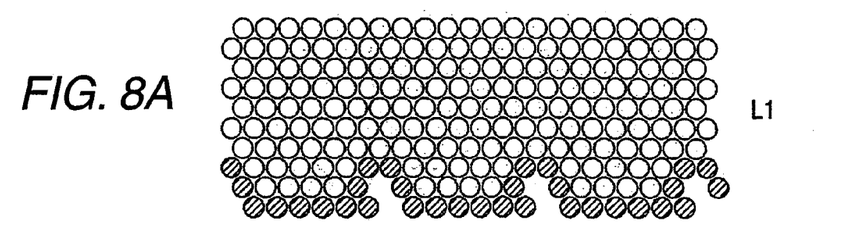
FIGS. 8A to 8E illustrate geometries of routable connection pads that are arranged on the respective wiring layers in a hexagonal grid array in which non-pad regions are set differently than in the example of FIGS. 7A to 7E.
Figure 8B:
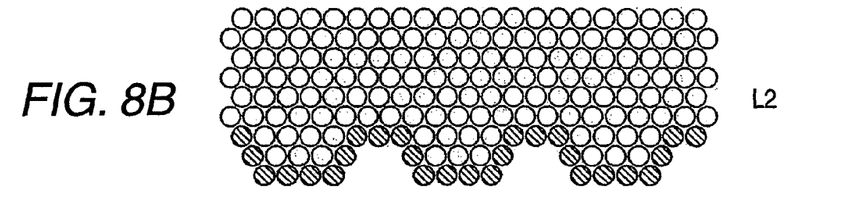
Figure 8C:
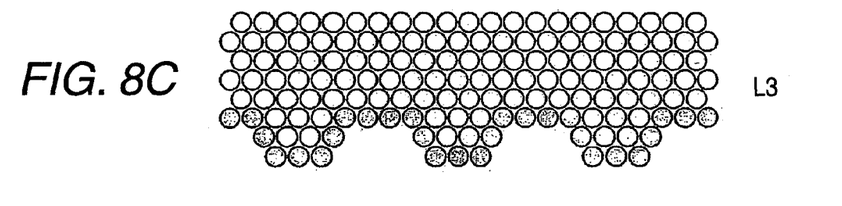
Figure 8D:
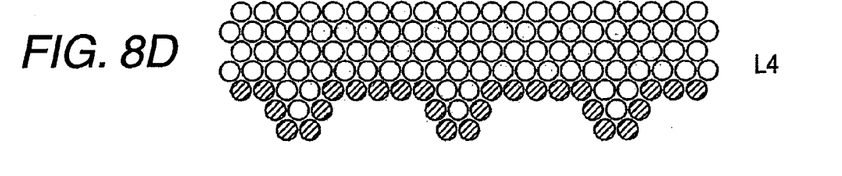
Figure 8E:
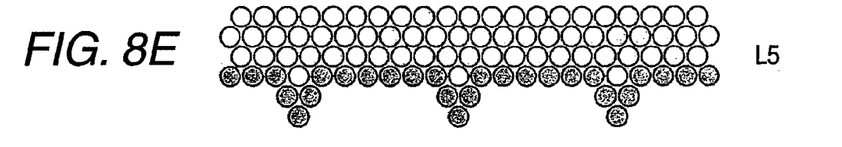

FIG. 6B is an enlarged view of one of the non-pad regions B. In this case, it is necessary to route out wiring patterns from six connection pads P1-P6 that face the non-pad region B.

In the case of the hexagonal grid array according to this embodiment, as in the case of the above-described square grid array, the following equation should be satisfied to route out wiring patterns from all connection pads facing the non-pad region B.

$$\{(Ndl+1)P-d-s\}/(w+s) \geq 2Ndr+Ndl(a+1)+2a-1 \quad (7),$$

where a is given by [(P−d−s)/(w+s)] (i.e., an integer of (P−d−s)/(w+s)).

As in Equation (1), a in the right side of Equation (7) means the number of wiring patterns that can be routed between the connection pads that are adjacent to each other.

Also in the case of the hexagonal grid array, the condition that no wiring pattern can pass between closest connection pads is given by the following equation:

$$P-d<w+2s. \quad (8)$$

In the case of the hexagonal grid array, the condition that one or more wiring patterns can pass between connection pads that are adjacent to each other with one connection pad interposed in between is given by the following equation:

$$(\sqrt{3} \times P - d - s)/(w+s) \geq 1 \quad (9)$$

Figure 3C:
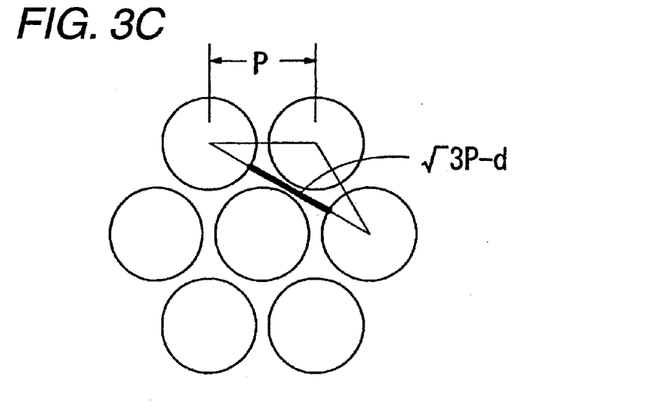

As shown in FIG. 3C, the interval between connection pads that are adjacent to each other with one connection pad interposed in between is given by $\sqrt{3}P-d$. Thus, Equation (9) can be derived.

FIGS. 7A to 7D show geometries of connection pads, from which wiring patterns are routed out in the respective wiring layers, in a case that non-pad regions B are set in the manner shown in FIG. 6. In this condition, wiring patterns are routed out from all connection pads facing each non-pad region B.

FIGS. 7A to 7E show connection pads (indicated by hatched circles or black circles) from which wiring patterns are routed out in first to fifth wiring layers L1-L5, respectively. In this example, as for each of the sixth wiring layer L6 and the following wiring layers, wiring patterns are routed out from the one outermost loop as in the ordinary method.

FIGS. 8A to 8E show an example in which connection pads area are arranged in a hexagonal grid fashion and non-pad regions B having 1-row/2-column are arranged along the outer periphery of a pad array area at a rate of one non-pad region B per seven rows.

FIGS. 8A to 8E show geometries of connection pads, from which wiring patterns are routed out in first to fifth wiring layers L1-L5, respectively. In this example, as for each of the seventh wiring layer L7 and the following wiring layers, wiring patterns are routed out from connection pads on the one outermost loop as in the case of the ordinary hexagonal grid array.

As described above, when non-pad regions B are set in a pad array area, the geometries of connection pads, from which wiring patterns are routed out in individual wiring layers, and the number of wiring layers that are necessary for routing out wiring patterns from all connection pads in the pad array area vary depending on the number of non-pad regions B or their pitch. In the case of the hexagonal grid array, it is preferable that a relationship $$N1 \leq (\text{interval between non-pad regions}) \leq N1 + (Ndr-1) \quad (10)$$

be satisfied, where L1 is the number of routing layers.

Table 1 shows a comparison result of the number of wiring patterns that can be routed out per a particular number of rows, between the related art and the present invention. In the present invention, a square grid array is applied and the bump pitch between the bumps of a semiconductor element; the diameter of connection pads; the width of wiring patterns; and the minimum interval between wiring patterns are used as parameters and the number of non-pad rows and the number of non-pad columns of each non-pad region B are varied.

TABLE 1

| Pitch | Pad diameter | Wiring pattern width | Wiring pattern interval | Number of routable non-pad rows | Number of wiring patterns | Number of non-pad columns | Number of routable pads | Number of wiring patterns that can be routed out per particular number of rows | | Gain (The present invention— Related Art) | The present invention/ Related Art |
|---|---|---|---|---|---|---|---|---|---|---|---|
| | | | | | | | | Related Art | The present invention | | |
| 80 | 60 | 10 | 10 | 1 | 4 | 1 | 3 | 3 | 5 | 2 | 1.7 |
| 80 | 60 | 10 | 10 | 2 | 8 | 2 | 6 | 4 | 8 | 4 | 2.0 |
| 80 | 60 | 10 | 10 | 4 | 16 | 6 | 16 | 6 | 18 | 12 | 3.0 |
| 80 | 60 | 8 | 8 | 1 | 5 | 2 | 5 | 3 | 7 | 4 | 2.3 |
| 80 | 60 | 8 | 8 | 2 | 10 | 4 | 10 | 4 | 12 | 8 | 3.0 |
| 80 | 60 | 8 | 8 | 6 | 30 | 12 | 30 | 8 | 32 | 24 | 4.0 |
| 80 | 60 | 6 | 6 | 2 | 14 | 6 | 14 | 7 | 16 | 9 | 2.3 |
| 80 | 50 | 8 | 8 | 4 | 21 | 8 | 20 | 11 | 22 | 11 | 2.0 |
| 100 | 75 | 10 | 10 | 1 | 5 | 2 | 5 | 3 | 7 | 4 | 2.3 |
| 100 | 75 | 10 | 10 | 2 | 10 | 4 | 10 | 4 | 12 | 8 | 3.0 |
| 100 | 75 | 10 | 10 | 6 | 30 | 12 | 30 | 8 | 32 | 24 | 4.0 |
| 100 | 75 | 15 | 15 | 1 | 3 | 1 | 3 | 3 | 5 | 2 | 1.7 |
| 100 | 75 | 15 | 15 | 2 | 7 | 2 | 6 | 4 | 8 | 4 | 2.0 |

When the bump pitch is 80 μm, the pad diameter is 60 μm, and the wiring pattern width and interval are each equal to 10 μm or 8 μm, no wiring pattern can pass between adjoining connection pads (wiring patterns can only be routed out from the outermost loop). In contrast according to the method of the invention, when the wiring pattern width and interval are each equal to 10 μm, two times more wiring patterns can be routed out than in the related-art method if the number of non-pad rows and the number of non-pad columns are each two, and three times more wiring patterns can be routed out if the number of non-pad rows is four and the number of non-pad columns is six. When the wiring pattern width and interval are each equal to 8 μm, four times more wiring patterns can be routed out than in the related-art method if the number of non-pad rows is six and the number of non-pad columns is 12. That is, whereas two, three, or four wiring layers are required in the related-art method, the method of the invention may require only one wiring layer.

Table 2 shows a comparison result between the wiring pattern routing efficiency in the related-art method and that in the present invention (non-pad regions B are provided) in the case of the hexagonal grid array.

TABLE 2

| Pitch | Pad diameter | Wiring pattern width | Wiring pattern interval | Number of non-pad rows | Number of routable wiring patterns | Number of non-pad columns | Number of routable pads | Number of wiring patterns that can be routed out per particular number of rows | | Gain (The present invention— Related Art) | The present invention/ Related Art |
|---|---|---|---|---|---|---|---|---|---|---|---|
| | | | | | | | | Related Art | The present invention | | |
| 80 | 60 | 10 | 10 | 1 | 4 | 2 | 4 | 3 | 6 | 3 | 2.0 |
| 80 | 60 | 10 | 10 | 5 | 20 | 8 | 20 | 7 | 22 | 15 | 3.1 |
| 80 | 60 | 8 | 8 | 1 | 5 | 2 | 4 | 3 | 6 | 3 | 2.0 |
| 80 | 60 | 8 | 8 | 3 | 15 | 6 | 14 | 5 | 16 | 11 | 3.2 |
| 80 | 60 | 8 | 8 | 7 | 35 | 14 | 34 | 9 | 36 | 27 | 4.0 |
| 80 | 60 | 6 | 6 | 2 | 14 | 6 | 13 | 7 | 15 | 8 | 2.1 |
| 100 | 75 | 10 | 10 | 1 | 5 | 2 | 4 | 3 | 6 | 3 | 2.0 |
| 100 | 75 | 10 | 10 | 3 | 15 | 6 | 14 | 5 | 16 | 11 | 3.2 |
| 100 | 75 | 12 | 12 | 1 | 4 | 2 | 4 | 3 | 6 | 3 | 2.0 |
| 100 | 75 | 12 | 12 | 4 | 17 | 7 | 17 | 6 | 19 | 13 | 3.2 |
| 100 | 75 | 15 | 15 | 2 | 7 | 3 | 7 | 4 | 9 | 5 | 2.3 |
| 100 | 75 | 20 | 20 | 5 | 12 | 4 | 12 | 7 | 14 | 7 | 2.0 |

As can be seen from the result of Table 2, when the bump pitch is 80 μm, the pad diameter is 60 μm, and the wiring pattern width and interval are each equal to 10 μm or 8 μm, no wiring pattern can pass between adjoining connection pads. In contrast according to the present invention, when the wiring pattern width and interval are each equal to 10 μm, two times more wiring patterns can be routed out than in the related-art method if the number of non-pad rows is one and the number of non-pad columns is two, and also three or more times more wiring patterns can be routed out if the number of non-pad rows is five and the number of non-pad columns is eight. When the wiring pattern width and interval are each equal to 8 μm, four times more wiring patterns can be routed out than in the related-art method if the number of non-pad rows is seven and the number of non-pad columns is 14. It is thus understood that also in the case of the hexagonal grid array the wiring pattern routing efficiency is increased by providing non-pad regions B.

(One-Layer Routing Method)

In the multilayer wiring boards according to the above embodiments, they are designed so that the number of wiring layers is minimized in routing out wiring patterns from the connection pads that are disposed in the pad array area. On the other hand, in a case where the manufacturing cost of a wiring board on which a semiconductor element is to be mounted is taken into consideration, another approach is conceivable that, among the wiring patterns to be formed in the wiring board, wiring patterns connected to signal lines of the semiconductor element are finely formed with high-precision and other wiring patterns connected to ground lines, power lines, etc. are not finely formed.

The build-up method, which is used for forming fine wiring patterns in wiring board manufacturing methods, has an advantage that high-precision wiring patterns can be formed. However, high-precision process conditions are required, and thus this leads to high in the manufacturing cost and low in the production yield. In particular, forming multiple wiring layers by the build-up method is problematic in light of the manufacturing cost and the production yield. The connection pads arranging method according to this embodiment is characterized in that connection pads for signal electrodes are arranged in clusters along the outer periphery of a pad array area of a multilayer wiring board and wiring patterns are routed out from those connection pads in one wiring layer.

Figures 9A, 9B:
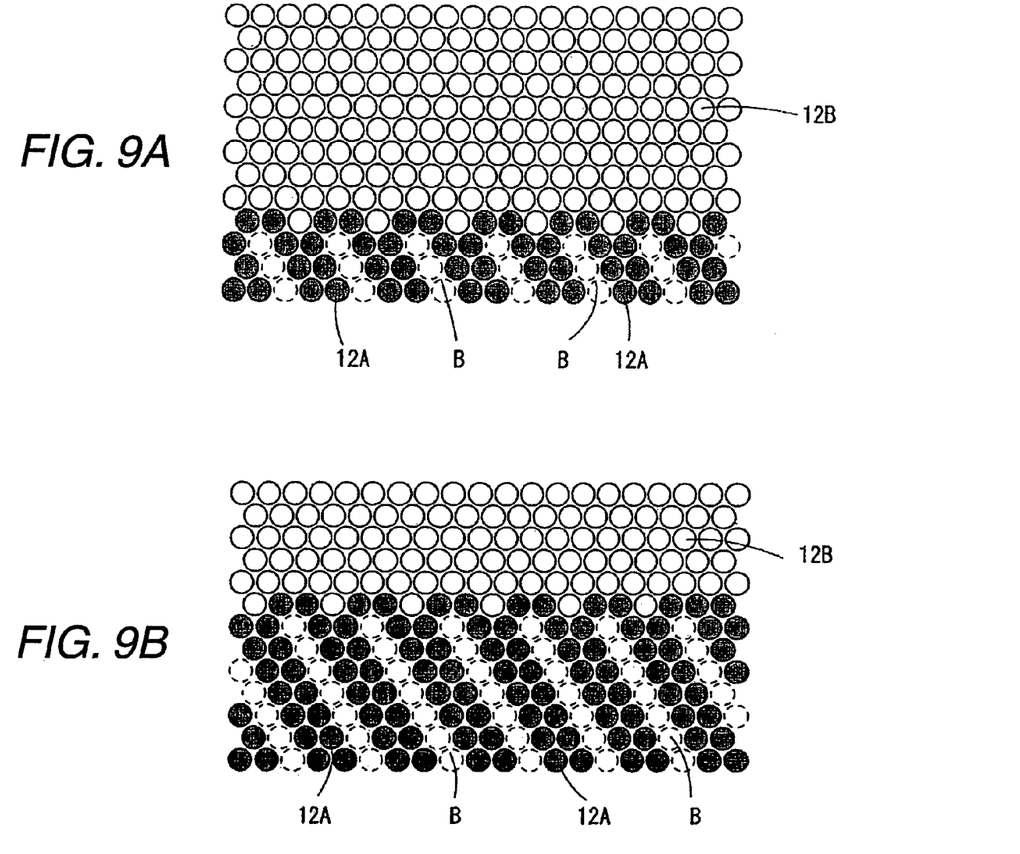
FIGS. 9A and 9B illustrate another example of non-pad regions in the hexagonal grid array.

FIGS. 9A and 9B show example geometries (hexagonal grid array) in which wiring patterns are routed out from connection pads to be connected to signal lines of a semiconductor element in one wiring layers in which the above wiring pattern routing method is utilized.

FIG. 9A shows an example in which non-pad regions B having 1-row/3-column are set along the outer periphery of a pad array area at a rate of one non-pad region B per three rows. FIG. 9B shows an example in which non-pad regions B having 1-row/7-column are set at a rate of one non-pad region B per three rows.

Figure 10A:
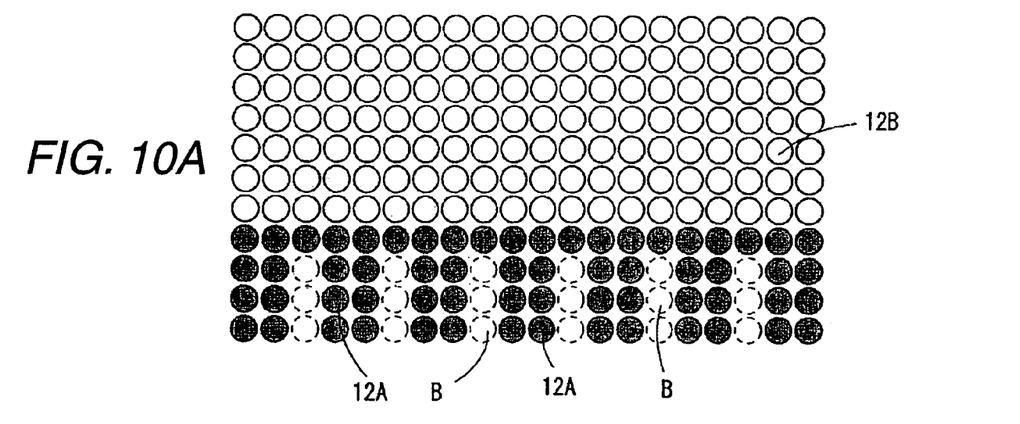
FIGS. 10A and 10B illustrate another example of non-pad regions in the square grid array.
Figure 10B:
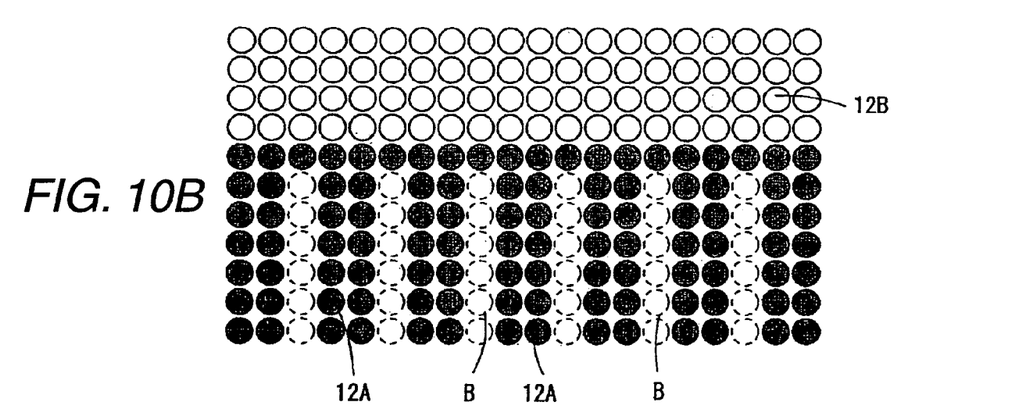

FIGS. 10A and 10B show example geometries (square grid array), in which wiring patterns are routed out from connection pads to be connected to signal lines of a semiconductor element in one wiring layer. FIG. 10A shows an example in which non-pad regions B having 1-row/3-column are set along the outer periphery of a pad array area at a rate of one non-pad region B per three rows. FIG. 10B shows an example in which non-pad regions B having 1-row/6-column are set at a rate of one non-pad region B per three rows.

By satisfying the conditions for routing wiring patterns from all connection pads 12A that face each non-pad region B, in each of the examples of FIGS. 9A to 10B, wiring patterns can be routed out from all connection pads 12A shown in the drawing, in other words connection pads 12A that are disposed in an outer peripheral portion of the pad array area, in one wiring layer.

In this embodiment, the non-pad regions B are set along the outer periphery of the pad array area at a rate of one non-pad region B per three rows, so that many wiring patterns as possible can be routed out from connection pads by utilizing the pad array area effectively. Wiring patterns are routed out from the connection pads 12A in the first wiring layer, whereby for the second and following wiring layers connection pads 12B are arranged in an ordinary hexagonal or square geometry. Wiring patterns are routed out from the connection pads 12B in order starting from the outermost loop.

Figure 11A:
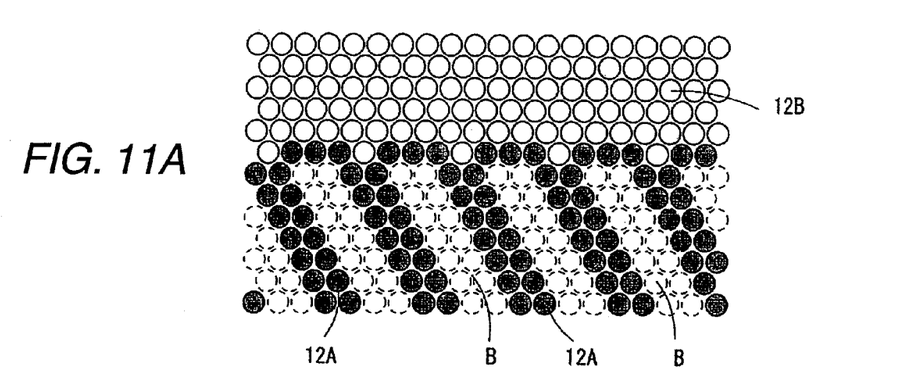
FIGS. 11A and 11B show further examples of non-pad regions in the hexagonal grid array and the square grid array, respectively.
Figure 11B:
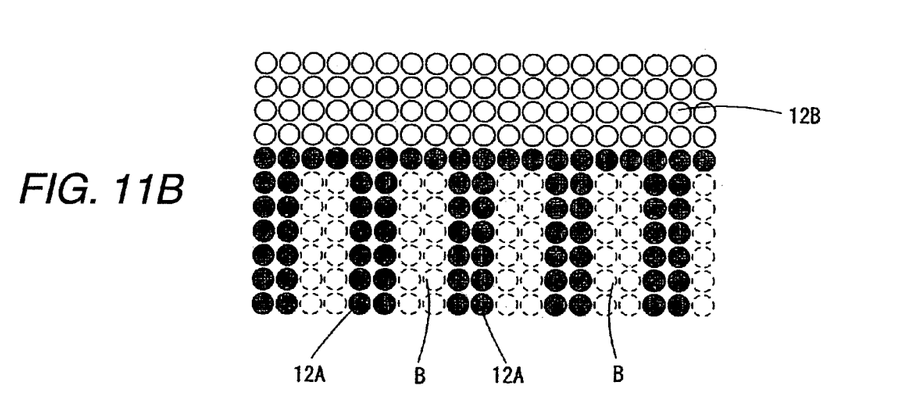

FIGS. 11A and 11B show other examples in which wiring patterns are routed out from connection pads to be connected to signal lines in one wiring layer. In each of the above-described embodiments of FIGS. 9A to 10B, the number of non-pad rows of the non-pad region B is one. When the number of non-pad rows of each non-pad region B is set at the minimum number of one, the spaces for formation of wiring patterns are restricted. Therefore, if the number of non-pad columns of each non-pad region B is set at a plural number, it may be difficult to route out wiring patterns from all connection pads facing each non-pad region B. In such a case, as shown in FIGS. 11A and 11B, non-pad regions B having 2-row may be arranged along the outer periphery of a pad array area at a rate of one non-pad region B per four rows so as to secure sufficient spaces for formation of wiring patterns. Further, it is possible to route out wiring patterns from all connection pads 12A that face each non-pad region B.

As shown in FIGS. 9A to 11B, if a multilayer wiring board can be designed so that connection pads to be connected to signal lines are disposed in an outer peripheral portion of a pad array area and wiring patterns can be routed out from those connection pads in one wiring layer, the multilayer wiring board can be manufactured easily and can easily mount a semiconductor element having a large number of inputs and outputs.

Naturally, for such a pad geometry, connection pads should be arranged in the multilayer wiring board according to the number of bumps (electrodes) of the semiconductor element or their geometry. In general, a multilayer wiring board can be designed in this manner because not all bumps (electrodes) provided in a semiconductor element are used for signal lines (i.e., the signal lines are connected to only part of the bumps).

Although the above description focuses on the feature that wiring patterns are routed out from connection pads to be connected to signal lines in one wiring layer, the present invention encompasses a case of routing out wiring patterns from connection pads to be connected to lines other than signal lines in one wiring layer.

In a case where wiring patterns cannot be routed out from all connection pads to be connected to signal lines in one wiring layer, it is advantageous that wiring patterns to be connected to the signal lines or need to be formed with high accuracy are formed in two-layered wiring layers. Even if fine wiring patterns should be formed in two wiring layers, three wiring layers, or the like, the multilayer wiring board can be manufactured much more easily as compared with a case that all wiring layers should be formed by a high-precision process such as a build-up process.

In wiring board manufacturing processes, forming fine wiring patterns at a high density imposes severe limitation on the manufacturing accuracy. Therefore, in a case where wiring patterns to be connected to signal lines are routed out in one wiring layer as in this embodiment, only this wiring layer needs to be formed with high accuracy. Accordingly, a great advantage is thus provided that a wiring board can be manufactured with no particular change in process accuracy from wiring board manufacturing processes of the related art.

In the embodiments of FIGS. 9A to 11C, wiring patterns to be connected to signal lines are routed out in one wiring layer. Upon forming, in a multilayer wiring board, wiring patterns to be electrically connected to a semiconductor element, it is advantageous that wiring patterns to be connected to lines having important roles such as signal lines are formed by a manufacturing method having high process accuracy such as a build-up method and the other wiring patterns are formed by a manufacturing method having lower process accuracy instead of forming all wiring layers with the same process accuracy. Accordingly, the accuracy of the entire multilayer wiring board can be increased and thus this leads to lower in the manufacturing cost, and increase in the production yield.

In the embodiments of FIGS. 9A to 11B, wiring patterns to be connected to prescribed lines such as signal lines are routed out in one wiring layer, by utilizing the wiring pattern routing method for connection pads arranged in a hexagonal grid array or a square grid array. However, routing method of wiring patterns is not limited to the above wiring pattern routing methods.

For example, whereas, in the above methods, the pitch and the geometry of connection pads are the same over the entire pad array area, in the case where connection pads to be connected to signal lines are arranged in clusters in an outer peripheral portion of the pad array area and wiring patterns are routed out from these connection pads, the multilayer wiring board may be designed in such a manner that the pitch of the connection pads to be connected to the signal lines is increased in this portion, so that wiring patterns can be routed out more easily. In this case, it is necessary that a semiconductor element be designed in such a manner that the pitch of bumps (electrodes) be increased in an outer peripheral portion of an electrode forming surface where the signal lines are disposed.

A semiconductor device similar to that shown in FIG. 12 is formed by mounting a semiconductor element onto the semiconductor element mounting surface of the multilayer wiring board by flip-chip bonding. The semiconductor devices according to the exemplary embodiments can reduce the number of wiring layers of the multilayer wiring board. In particular, in the multilayer wiring boards as shown in FIGS. 9A to 11B, in which wiring patterns to be connected to principal lines such as signal lines are routed out in one wiring layer, the production yield of the multilayer wiring board can be increased and can be improved in electrical characteristics such as electrical connections of the wiring patterns.

While the present invention has been shown and described with reference to certain exemplary embodiments thereof, it will be understood by those skilled in the art that various changes in form and details may be made therein without departing from the spirit and scope of the invention as defined by the appended claims, It is aimed, therefore, to cover in the appended claim all such changes and modifications as fall within the true spirit and scope of the present invention.

What is claimed is:

1. A multilayer wiring board, comprising:
a substrate;
a plurality of connection pads disposed on the substrate and arranged in a square grid fashion in a pad array area, wherein non-pad regions are arranged periodically along an outer periphery of the pad array area;
a plurality of wiring patterns each connected to a corresponding one of the plurality of connection pads,
wherein the connection pads and the wiring patterns are arranged so as to satisfy:

$$\{(Ndl+1)P-d-s\}/(w+s) \geq 2Ndr+Ndl(a+1)+2a,$$

wherein P is a pad pitch of the connection pads, d is a diameter of the connection pads, s is a minimum interval between the wiring patterns and is a minimum interval between the wiring pattern and the connection pad that are adjacent to each other, w is a minimum width of the wiring patterns, Ndl is the number of non-pad rows in each of the non-pad regions, Ndr is the number of non-pad columns in each of the non-pad region, and a is an integer of $(P-d-s)/(w+s)$.

2. The multilayer wiring board according to claim 1, wherein the connection pads and the wiring patterns are arranged so as to satisfy:

$$(\sqrt{2} \times P - d - s)(w+s) \geq 1.$$

3. A multilayer wiring board, comprising:
a substrate;
a plurality of connection pads disposed on the substrate and arranged in a hexagonal grid fashion in a pad array area, wherein non-pad regions are arranged periodically along an outer periphery of the pad array area;

a plurality of wiring patterns each connected to a corresponding one of the plurality of connection pads,
wherein the connection pads and the wiring patterns are arranged so as to satisfy:

$$\{(Ndl+1)P-d-s\}/(w+s) \geq 2Ndr+Ndl(a+1)+2a-1$$

wherein P is a pad pitch of the connection pads, d is a diameter of the connection pads, s is a minimum interval between the wiring patterns and is a minimum interval between the wiring pattern and the connection pad that are adjacent to each other, w is a minimum width of the wiring patterns, Ndl is the number of non-pad rows in each of the non-pad regions, Ndr is the number of non-pad columns in each of the non-pad region, and a is an integer of P−d−s)/(w+s).

4. The multilayer wiring board according to claim 3, wherein the connection pads and the wiring patterns are arranged so as to satisfy:

$$(\sqrt{3} \times P - d - s)/(w+s) \geq 1.$$

5. The multilayer wiring board according to claim 1, wherein the connection pads are arranged so as to satisfy:

$$P-d<w+2s.$$

6. The multilayer wiring board according to claim 3, wherein the connection pads are arranged so as to satisfy:

$$P-d<w+2s.$$

7. The multilayer wiring board according to claim 1, wherein each of the non-pad regions is formed by removing one connection pad in a row direction of the pad array area and plural connection pads in a column direction of the pad array area.

8. The multilayer wiring board according to claim 3, wherein each of the non-pad regions is formed by removing one connection pad in a row direction of the pad array area and plural connection pads in a column direction of the pad array area.

9. The multilayer wiring board according to claim 7, wherein the non-pad regions are arranged at a rate of one non-pad region per three rows.

10. The multilayer wiring board according to claim 8, wherein the non-pad regions are arranged at a rate of one non-pad region per three rows.

11. The multilayer wiring board according to claim 1, wherein each of the non-pad regions is formed by removing two connection pads in a row direction of the pad array area and plural connection pads in a column direction of the pad array area, and
wherein the non-pad regions are arranged at a rate of two non-pad regions per four rows.

12. The multilayer wiring board according to claim 3, wherein each of the non-pad regions is formed by removing two connection pads in a row direction of the pad array area and plural connection pads in a column direction of the pad array area, and
wherein the non-pad regions are arranged at a rate of two non-pad regions per four rows.

13. A semiconductor device comprising:
the multilayer wiring board according to claim 1; and
a semiconductor element mounted on the multilayer wiring board by flip-chip bonding.

* * * * *